United States Patent [19]

Yoshida et al.

[11] Patent Number: 5,581,570
[45] Date of Patent: Dec. 3, 1996

[54] SEMICONDUCTOR LASER DEVICE

[75] Inventors: Yasuaki Yoshida; Akira Takemoto, both of Itami, Japan

[73] Assignee: Mitsubishi Denki Kabushiki Kaishi, Tokyo, Japan

[21] Appl. No.: 408,301

[22] Filed: Mar. 22, 1995

[30] Foreign Application Priority Data

Mar. 25, 1994 [JP] Japan ..................... 6-055530

[51] Int. Cl.⁶ ........................................ H01S 3/19
[52] U.S. Cl. ............................. 372/46; 372/45
[58] Field of Search .......................... 372/45, 46

[56] References Cited

U.S. PATENT DOCUMENTS 5,416,790  5/1995  Yodoshi et al. ................ 372/46

FOREIGN PATENT DOCUMENTS

| 0542479 | 11/1992 | European Pat. Off. |
| 1-235393 | 9/1989 | Japan . |
| 6-260716 | 9/1994 | Japan . |

*Primary Examiner*—James W. Davie
*Attorney, Agent, or Firm*—Leydig, Voit & Mayer

[57] ABSTRACT

A semiconductor laser device includes semiconductor layers including an active layer and cladding layers sandwiching the active layer and current injecting structure for regulating a region in the active layer into which current is injected. A light confinement coefficient in the current injection region perpendicular to the active layer is smaller than a light confinement coefficient in the same direction of a saturable absorption region. The function of the saturable absorption region is enhanced and pulsation oscillation can be produced at a high power light output.

9 Claims, 8 Drawing Sheets

SEMICONDUCTOR LASER DEVICE

FIELD OF THE INVENTION

The present invention relates to a semiconductor laser and, more particularly, to a semiconductor laser that performs pulsation oscillation and a process for fabricating the laser.

BACKGROUND OF THE INVENTION

FIG. 5 is a cross-sectional view illustrating a prior art inner stripe type semiconductor laser structure in a direction perpendicular to the resonator.

In the FIG., an n type $Al_{0.5}Ga_{0.5}As$ lower cladding layer 2 is disposed on an n type GaAs substrate 1. An $Al_{0.15}Ga_{0.85}As$ active layer 3 is disposed on the n type $Al_{0.5}Ga_{0.5}As$ lower cladding layer 2. A p type $Al_{0.5}Ga_{0.5}As$ upper cladding layer 4 is disposed on the $Al_{0.15}Ga_{0.85}As$ active layer 3. A stripe-shaped ridge 9 is formed from the p type $Al_{0.5}Ga_{0.5}As$ upper cladding layer 4. N type GaAs current blocking layers 5 are disposed, burying the ridge 9 comprising the p type $Al_{0.5}Ga_{0.5}As$ upper cladding layer 4. A p type GaAs contact layer 6 is disposed on the ridge 9 comprising the upper cladding layer 4 and on the current blocking layer 5. An n side electrode 7 is formed at the rear surface of the substrate 1. A p side electrode 8 is disposed on the contact layer 6. Reference numeral 10 designates an active region and numeral 11 designates a saturable absorption region.

First of all, on the n type GaAs substrate 1, an n type $Al_{0.5}Ga_{0.5}As$ lower cladding layer 2, an $Al_{0.15}Ga_{0.85}As$ active layer 3 $t_1$ thick, and a p type $Al_{0.5}Ga_{0.5}As$ upper cladding layer 4 are grown by MOCVD or MBE.

Next, side portions of the upper cladding layer 4, except for a portion forming the ridge 9, are removed by etching, leaving a remaining thickness d of the upper cladding layer 4 and, thereafter, an n type GaAs current blocking layer 5 is grown to bury the ridge 9 of the upper cladding layer 4 by MOCVD. Subsequently, a p type GaAs contact layer 8 is grown to cover the ridge 9 of the upper cladding layer 4 and the current blocking layer 5.

Thereafter, an n side electrode 7 comprising Cr/Au or TiPt/Au is formed at the side of the substrate 1 and a p side electrode 8 comprising Cr/Au or TiPt/Au is formed on the p type GaAs contact layer 8, thereby completing the semiconductor laser shown in FIG. 5.

In the semiconductor laser having the above structure, the active layer 3 is divided into the active region 10 and the saturable absorption region 11. The active region 10 is a region into which a current restricted by the current blocking layer 5 is injected and in which laser oscillation occurs. The saturable absorption region 11 has the same structure as the active region 10, but there is no injection of current and it functions as saturable absorber. In other words, when the laser light from the active region 10 is weak, the saturable absorber functions as an absorber to the laser light, and while the light intensity increases to some extent, the absorption of light stops and the saturable absorber functions as a transparent material. Accordingly, the saturable absorber functions as a Q switch for light. By varying the width W of the active region 10 and the remaining thickness d of the upper cladding layer 4 and adjusting the proportion of the light passing from the active region 10 into the saturable absorption region 11, the laser light output can be varied with time as shown in FIG. 6(c), thereby providing pulsation oscillation.

The pulsation oscillation laser has a low coherency of the laser light and has low return light noise and modal noise, thereby serving effectively as an optical disk light source and a high speed LAN (local area network) light source.

In order to produce such a pulsation oscillation laser, it is experimentally well known that it is required to narrow the width W to below 5 μm and to adjust the thickness d to decrease the equivalent refractive index difference Δn between the active region 10 and the saturable absorption region 11 (normally $\Delta n \leq 0.01$). However, because the allowable range of the width W and the thickness d are narrow and their adjustments are difficult, it is difficult to produce a pulsation oscillation at a high power light output, for example, 10 mW and, it is also difficult to fabricate the pulsation oscillation laser at high yield.

SUMMARY OF THE INVENTION

It is an object of the invention to provide a semiconductor laser that can produce a pulsation oscillation at a high power light output and can be fabricated at high yield.

Another object of the present invention is to provide a method for fabricating such a pulsation oscillation laser.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device comprises semiconductor layers including an active layer and cladding layers sandwiching the active layer, and a current injecting means for regulating a region of the active layer into which a current is injected. A light confinement coefficient for confining light perpendicular to the current injection region into which current is injected is lower than a light confinement coefficient perpendicular to the saturable absorption region into which no current is injected. Therefore, the function of the saturable absorption region is enhanced and the pulsation oscillation can be produced at a high power light output.

According to a second aspect of the present invention, in the semiconductor laser device, an active layer comprises a double heterojunction structure, and the thickness of the active layer at the current injection region into which current is injected is thinner than the thickness of the active layer at the saturable absorption region into which no current is injected. Therefore, the function of the saturable absorption region is enhanced and pulsation oscillation can be produced at a high light output.

According to a third aspect of the present invention, in the semiconductor laser device, an active layer comprises a multi-quantum well structure, and the light confinement layer at the current injection region into which current is injected is smaller than the thickness of the light confinement layer at the saturable absorption region into which no current is injected. Therefore, the function of the saturable absorption region is enhanced and pulsation oscillation can be produced at a high power light output.

According to a fourth aspect of the present invention, in the semiconductor laser device, an active layer comprises a multi-quantum well structure, and the number of well layers of the active layer at the current injection region into which current is injected is smaller than the number of well layers of the active layer at the saturable absorption region into which no current is injected. Therefore, the function of the saturable absorption region is enhanced and pulsation oscillation can be produced at a high power light output.

According to a fifth aspect of the present invention, in the semiconductor laser device, an active region comprises a multi-quantum well structure, and the well layers of the active layer at the current injecting region into which current is injected are thinner than the well layers of the active layer at the saturable absorption region into which no current is injected. Therefore, the function of the saturable absorption region is enhanced and pulsation oscillation can be produced at a high power light output.

According to a sixth aspect of the present invention, the semiconductor laser device comprises semiconductor layers including an active layer and cladding layers sandwiching the active layer, and a current injecting means for regulating a region of the active layer into which a current is injected. The differential gain of the active layer at the current injecting region into which current is injected is smaller than the differential gain at the saturable absorption region into which no current is injected. Therefore, the function of the saturable absorption region is enhanced and pulsation oscillation can be produced at a high power light output.

According to a seventh aspect of the present invention, in the semiconductor laser device, an active layer at the current injecting region is a bulk material and the active layer at the saturable absorption region is a multi-quantum well structure. Therefore, the function of the saturable absorption region is enhanced and pulsation oscillation can be produced at a high power light output.

According to an eighth aspect of the present invention, the semiconductor laser device comprises semiconductor layers including an active layer and cladding layers sandwiching the active layer, and a current injecting means for regulating a region of the active region into which a current is injected. A saturable absorption layer is provided at a position in the cladding layer parallel to the active layer and has an energy band gap that is equal to or narrower than that of the active layer. The saturable absorption layer contains dopant impurities in such a concentration that there is no barrier to majority carriers at the cladding layers. Therefore, the function of the saturable absorption region is enhanced and pulsation oscillation can be produced at a high power light output.

According to a ninth aspect of the present invention, in the semiconductor laser device, saturable absorption layers are provided at positions in the upper and lower cladding layers, respectively. Therefore, the function of the saturable absorption region is enhanced and pulsation oscillation can be produced at a high power light output.

According to a tenth aspect of the present invention, a fabrication method includes growing semiconductor layers including a first active layer and cladding layers sandwiching the active layer on a semiconductor substrate, etching and removing sides of the semiconductor layers, exposing the lower cladding layer to form a mesa at a part of the semiconductor layers, successively growing on the exposed surface of the lower cladding layer at both sides of the mesa, second active layers having a structure different from that of the first active layer of the mesa and in which second active layers a light confinement coefficient perpendicular to the first active layer of the mesa is smaller than the light confinement coefficient perpendicular to the saturable absorption regions comprising the second active layers at both sides of the active region, growing an upper cladding layer and current blocking layers burying the mesa, and growing a contact layer on the mesa and the current blocking layer, and forming an electrode at a rear surface of the semiconductor substrate and another electrode on the contact layer. A semiconductor laser producing pulsation oscillation at a high power light output is thus fabricated at high yield without a complicated fabrication process.

According to an eleventh aspect of the present invention, a fabricating method includes growing on a semiconductor substrate, semiconductor layers including an active layer, upper and lower cladding layers sandwiching the active layer, and a saturable absorption layer comprising a composition having a band gap energy that is equal to or narrower than that of the active layer, which absorption layer is positioned at a portion of at least one of the cladding layers, etching and removing side portions of the semiconductor layers to form a mesa in the semiconductor layers and to leave portions of the upper cladding layer, growing current blocking layers at both sides of the mesa of the semiconductor layer, burying the mesa and growing a contact layer on the semiconductor layers of the mesa and the current blocking layers, and forming an electrode at a rear surface of the semiconductor layer and another electrode on the contact layer. Therefore, a semiconductor laser producing pulsation oscillation at a high power light output is fabricated at high yield without a complicated fabrication process.

DETAILED DESCRIPTION OF THE PREFERRED EMBODIMENTS

Embodiment 1

As a model for theoretically analyzing pulsation oscillation of a semiconductor laser, an analysis model employing saturable absorption, described in Yamada, Institute of Electronics and Communication Engineers, Technical Report OQE92-16), is used.

Figure 5:
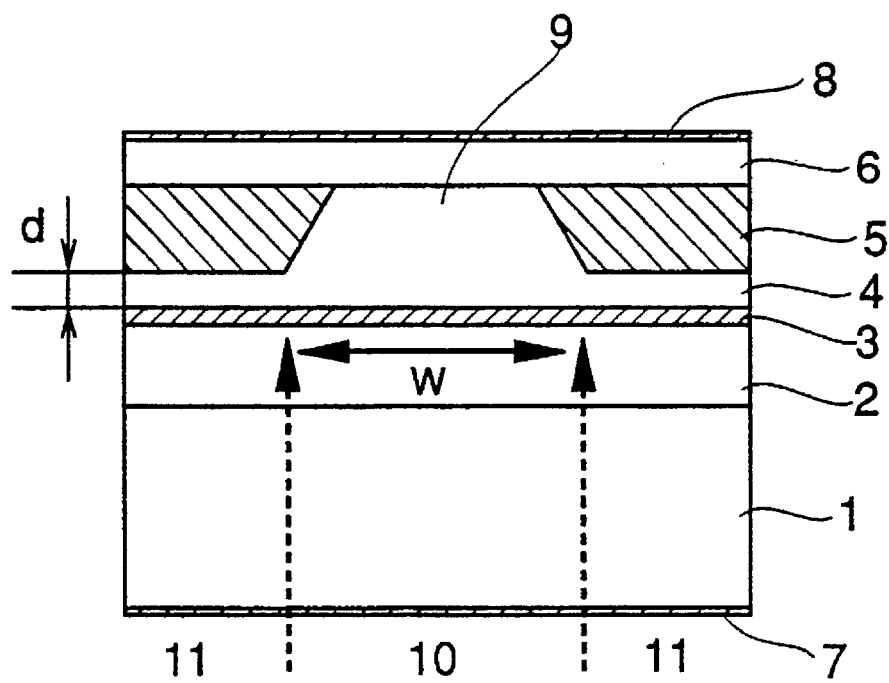
FIG. 5 is a cross-sectional view illustrating a prior art pulsation oscillation semiconductor laser.

In this model, with respect to a laser having the structure shown in FIG. 5, a rate equation incorporating photon density S, electron density $N_1$ of the active region, and electron density $N_2$ of the saturable absorption region as variables is established:

$$\frac{dS}{dt} = [a1(\xi 1x\xi 1y)(N1 - Ng1) + a2(\xi 2x\xi 2y)(N2 - Ng2) - Gth]S + C\frac{N1V1}{\tau s}$$

$$\frac{dN1}{dt} = \frac{a1\xi 1x\xi 1y}{V1}(N1 - Ng1)S - \frac{N1}{\tau s} - \frac{N1 - N2}{T12} + \frac{1}{eV1}$$

$$\frac{dN2}{dt} = \frac{a2\xi 2x\xi 2y}{V2}(N2 - Ng2)S - \frac{N2}{\tau s} - \frac{N2 - N1}{T21}$$

Here, respective coefficients are as follows:

ai: differential gain $\xi ix, iy$: light confinement coefficient (x represents a direction parallel to the active layer, y represents a direction perpendicular to the active layer, i=1 represents active region, i=2 represents saturable absorption region)

Gth : oscillation threshold gain

Ng1 : electron density providing a positive gain $\tau s$ : lifetime of an electron that is naturally emitted C : mixture ratio of natural emission Vi : volume of active region (i=1), saturable absorption region (i=2)

I : laser current

Tij : time constant of electron diffusion (T12 : from active region to saturable absorption region, T21 : from saturable absorption region to active region).

Figure 6A:
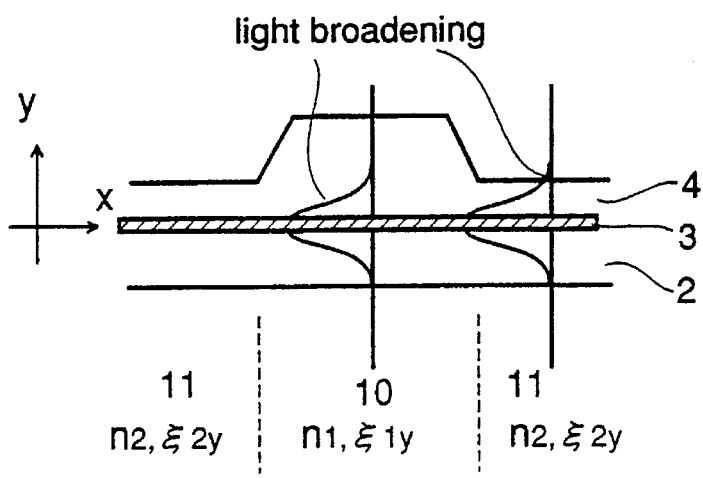
FIGS. 6(a) to 6(d) are diagrams for explaining the calculation procedure for the pulsation oscillation model due to saturable absorption.

Subsequently, as shown in FIG. 6(a), from the compositions and refractive indices of the active layer 3, cladding layers 2 and 4, and the blocking layer 5, the light confinement coefficients $\xi 1y$, $\xi 2y$ in the vertical direction and the equivalent refractive indices n1 and n2 are obtained. For example, $\xi y=0.30$, $\xi y=0.31$, n1=3.600, n2=3.599 are obtained.

Figure 6B:
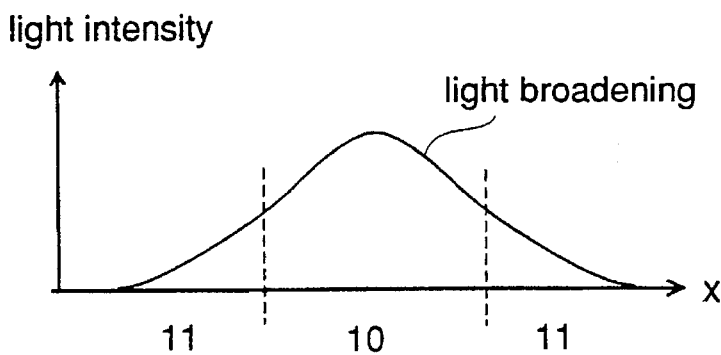

Next, a difference between the gain in the active region 10 and the gain in the saturable absorption region 11, for example, 100 cm$^{-1}$ is assumed, the horizontal transverse mode is calculated as shown in FIG. 6(b), and the gains at respective regions 10 and 11 are calculated from the rate equation for photon number=0. In other words, S=0 and when the gain difference coincides with the gain difference 100 cm$^{-1}$ which is first assumed, solutions are obtained.

Figure 6C:
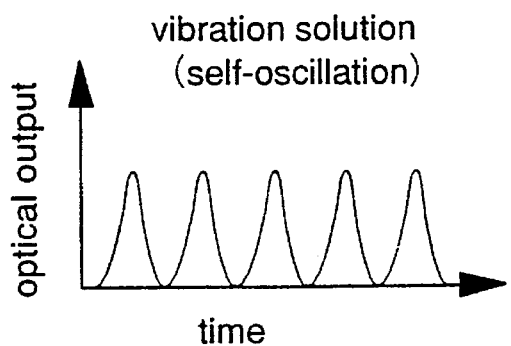
Figure 6D:
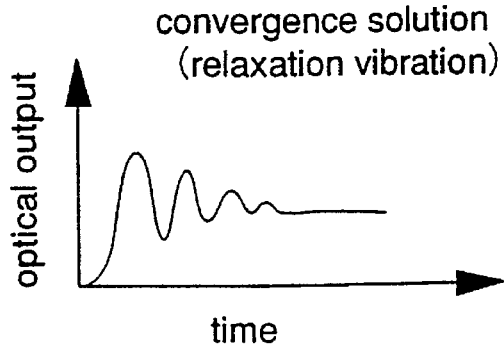

Finally, by removing the condition of S=0 and numerically calculating the rate equation to obtain the light output S, pulsation oscillation is determined to occur when the solution of the light output S is an oscillating solution as shown in FIG. 6(c). Pulsation oscillation does not occur when the solution is a converging solution as shown in FIG. 6(d).

Figure 3A:
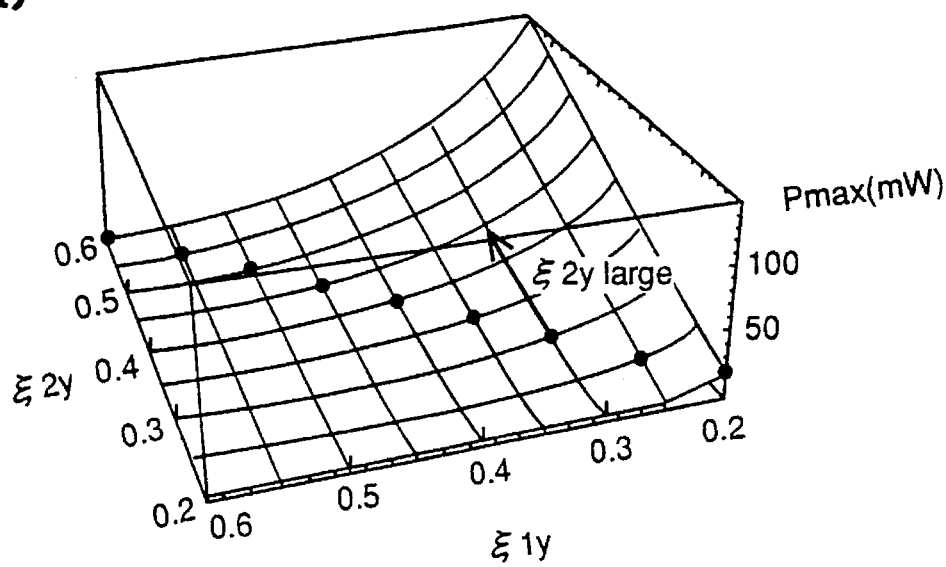
FIGS. 3(a) and 3(b) are diagrams illustrating relations between the light confinement coefficient in the vertical direction and the maximum light out-put at which the pulsation oscillation occurs with respect to the first and the second embodiments, respectively.
Figure 3B:
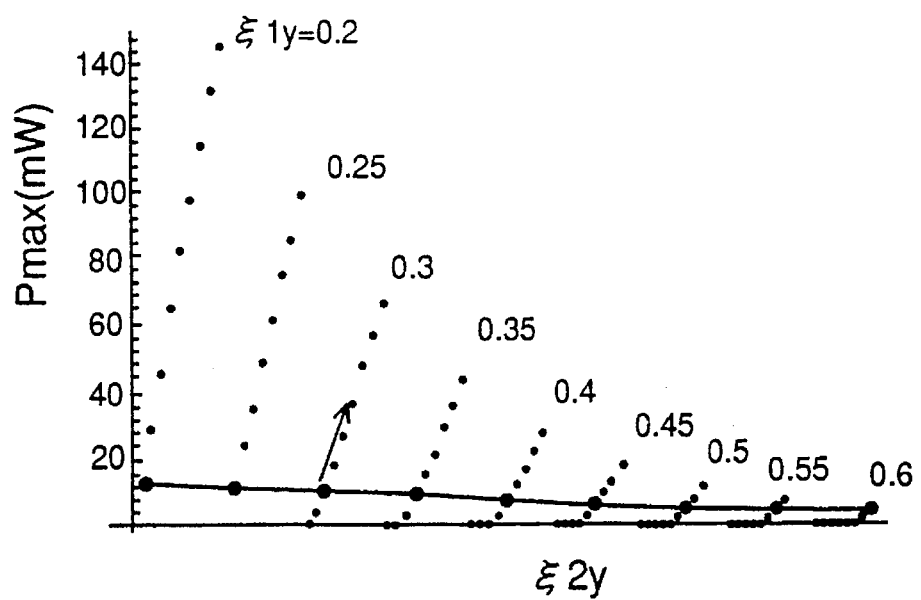

FIGS. 3(a) and 3(b) show calculated results of the maximum light output Pmax at which pulsation oscillation occurs with the light confinement coefficients $\xi 1y$, $\xi 2y$ plotted in directions on the basis of the described model. In the conventional laser, the active region 10 and the saturable absorption region 11 have the same structure and $\xi 1y$ is nearly equal to $\xi 2y$. Therefore, the Pmax is located on the points in FIG. 3(a) and, in the example of the FIG., as $\xi 1y=\xi 2y$ increases, the maximum light output Pmax at which pulsation oscillation occurs is minutely reduced.

Figure 1:
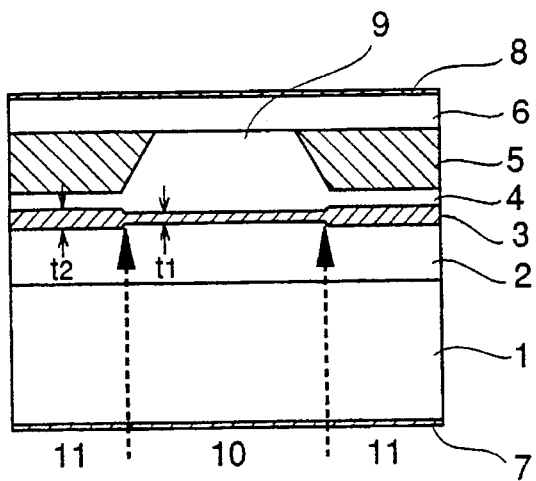
FIG. 1 is a cross-sectional view illustrating a pulsation oscillation semiconductor laser according to a first embodiment of the present invention.

As is apparent from the FIG, when $\xi 2y$ is increased to $\xi 1y=0.3$, in this numerical calculation, Pmax increases to ease the pulsation oscillation. When the light confinement coefficient $\xi 1y$ perpendicular to the active region 10 is decreased and the light confinement coefficient $\xi 2y$ in the vertical direction of the saturable absorption region 11 is increased, pulsation oscillation is likely to occur regardless of this numerical calculation, as is made apparent from a new calculation. In order to realize these conditions, in a laser having an active layer 3 in a DH structure (bulk, i.e., homogeneous structure), the active layer thickness t1 of the active region 10 is thinner than the active layer thickness t2 of the saturable absorption region 11 as shown in FIG. 1.

For example, in FIG. 1, the compositions of the respective layers are to those of the prior art and the thicknesses and carrier concentrations of respective layers are set as in the following:

(1) lower cladding layer 2 (n-$Al_{0.5}Ga_{0.5}As$) thickness: 1 to 3 µm carrier concentration: $3\times10^{16}$ to $2\times10^{18}cm^{-3}$ (2) upper cladding layer 4 (p-$Al_{0.5}Ga_{0.5}As$) outside the ridge 9 thickness: 0.3 to 1 µm carrier concentration: $3\times10^{16}$ to $2\times10^{18}cm^{-3}$ inside the ridge 9 thickness: 0.5 to 3 µm carrier concentration: $3\times10^{16}$ to $2\times10^{18}cm^{-3}$ (3) current blocking layer 5 (n-GaAs) thickness: 0.3 to 3 µm carrier concentration: above $1\times10^{16}cm^{-3}$ (it is restricted to be in a range not deteriorating the current-blocking effects)

(4) when the active layer 3 ($Al_{0.15}Ga_{0.85}As$) has a width W below 5 µm (preferably 1.5 to 3 µm), having thicknesses t1=0.08 µm and t2=0.11 µm, and a carrier concentration below $1\times10^{18}cm^{-3}$, then $\xi 1y=0.3$ and $\xi 2y=0.45$. As is apparent from FIGS. 3 (a) and 3(b), it is possible to raise the pulsation oscillation maximum output power about three times as compared with t1=t2=0.08 µm in the prior art example.

When the thickness t1 of the active region 10 is decreased and the thickness t2 of the saturable absorption region 11 is increased, the refractive index difference $\Delta n=n1-n2$ between the active region 10 and the saturable absorption region 11 varies toward a larger direction and influences the pulsation oscillation maximum output power. Therefore, this change also has to be considered during design.

First of all, on the n type GaAs substrate 1, an n type $Al_{0.5}Ga_{0.5}As$ lower cladding layer 2, an $Al_{0.15}Ga_{0.85}As$ active layer 3 having a thickness t1, and a p type $Al_{0.5}Ga_{0.5}As$ upper cladding layer 4 having a thickness 0.5 to 3 µm, which is the thickness in the ridge, are grown by MOCVD or MBE.

Next, the p type $Al_{0.5}Ga_{0.5}As$ upper cladding layer 4 and the $Al_{0.15}Ga_{0.85}As$ active layer 3 at the saturable absorption region 11, other than at the active region 10, are etched and removed, and on the exposed n type $Al_{0.5}Ga_{0.5}As$ lower cladding layer 2, an $Al_{0.15}Ga_{0.85}As$ active layer 3 of t2 thickness and further a p type $Al_{0.5}Ga_{0.5}As$ upper cladding layer 4 positioned thereon are grown to be 0.3 to 1 µm thick outside the ridge and, subsequently, n type GaAs current blocking layers 5 are grown burying the ridge 9 of the upper cladding layer 4, and a p type GaAs contact layer 8 is grown by MOCVD or MBE covering the ridge 9 of the upper cladding layer 4 and the current blocking layers 5.

Thereafter, an n side electrode 7 comprising Cr/Au or TiPt/Au is formed on the substrate 1 and a p side electrode 8 comprising Cr/Au or TiPt/Au is formed on the p type GaAs contact layer 8, thereby completing the semiconductor laser shown in FIG. 1.

In this first embodiment of the present invention, the active layer thickness t1 of the active region 10 is thinner than the active layer thickness t2 of the saturable absorption region 11 and the light confinement coefficient in the vertical direction of the active region 10, i.e., perpendicular to the substrate 1, is smaller than the light confinement coefficient perpendicular to the saturable absorption region 11. Therefore, the function of the saturable absorption region is enhanced and the maximum light output at which the pulsation oscillation occurs is increased, thereby preserving the pulsation oscillation at a high power light output. Accordingly, the allowable ranges of the width W of the active region 10 and the remaining thickness d of the upper cladding layer 4 are increased, thereby enabling fabrication of the pulsation oscillation laser at high yield. In addition, the fabrication of the laser can be performed with two crystal growth steps as in the-prior art, whereby fabrication is not so complicated.

Embodiment 2

Figure 2:
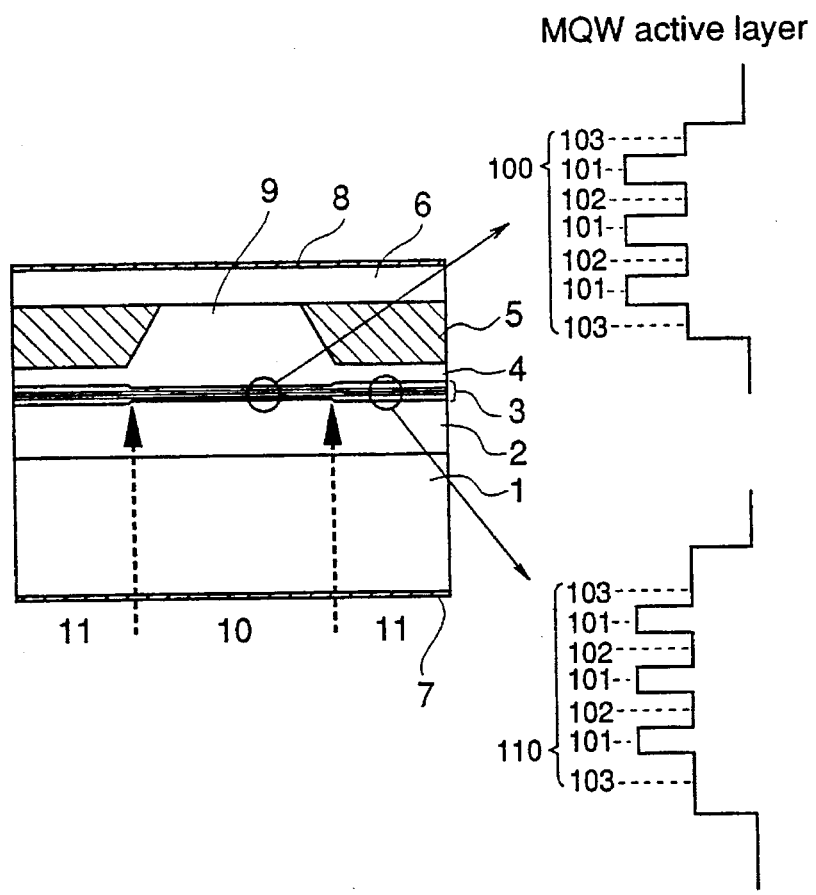
FIG. 2 is a cross-sectional view illustrating a pulsation oscillation semiconductor laser according to a second embodiment of the present invention.

FIG. 2 shows a semiconductor laser according to a second embodiment of the present invention. This second embodiment provides a laser including an active layer 3 comprising a multi-quantum well structure (MQW structure). In the figure, reference numeral 100 designates a SCH (separate confinement heterostructure), numeral 101 designates a well layer in the SCH structure, numeral 102 designates a barrier layer, and numeral 103 designates a light confinement layer having the SCH structure.

In FIG. 2, the compositions, thicknesses, and carrier concentrations, other than in the active layer 3, are the same as in the first embodiment. The composition and thickness of the well layer 101 are $Al_{0.1}Ga_{0.9}As$ and 100 Angstroms, respectively, the composition and the thickness of the barrier layer 102 are $Al_{0.35}Ga_{0.65}As$ and 80 Angstroms, respectively, and the composition of the light confinement layer 103 is the same as that of the barrier layer 102 and its thickness is about 500 Angstroms.

Figure 7:
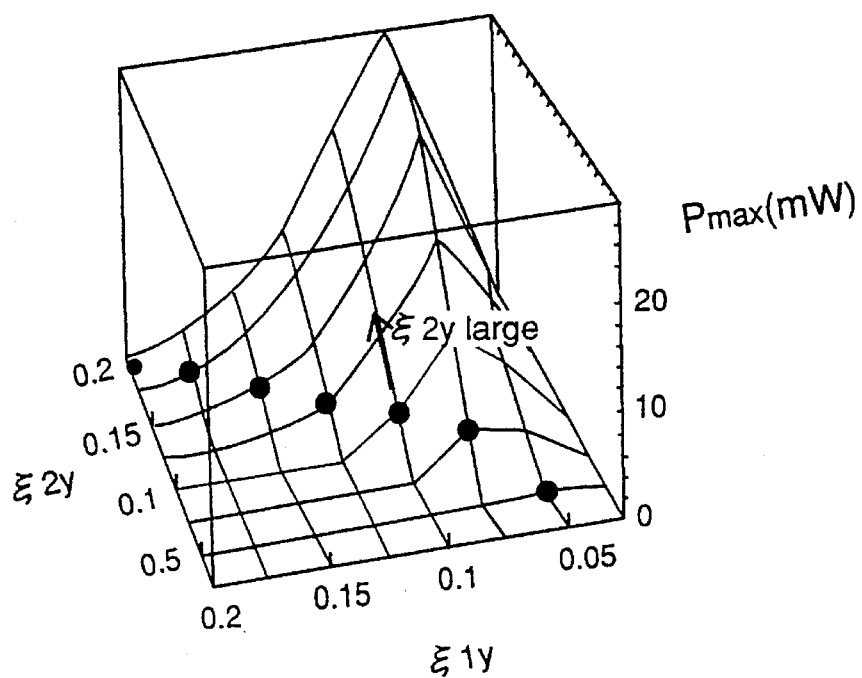
FIG. 7 is a diagram illustrating a relation between the light confinement coefficient in the vertical direction and the maximum light output during pulsation with respect to the second embodiment.

FIG. 7 shows a relation between the light confinement coefficient in the perpendicular direction and the maximum light output in the pulsation oscillation when the number-of well layers of the MQW structure is five. From this FIG. 7, while the light confinement coefficient is low in the MQW structure relative to the DH structure, when the light confinement coefficient $\xi 1y$ perpendicular to the active region 10, i.e., perpendicular to the substrate 1, is low and the light confinement coefficient $\xi 2y$ perpendicular to the saturable absorption region 11 is high, pulsation oscillation is likely to occur.

In the MQW structure, the perpendicular light confinement coefficient depends on the thickness and the number of well layers 101 and the thickness of the light confinement layer 103.

Figure 8:
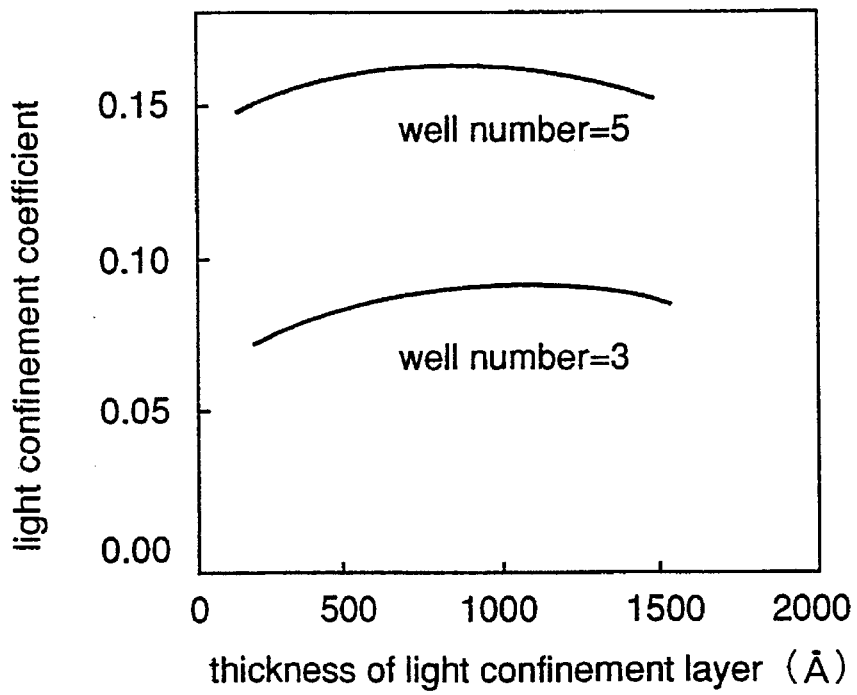
FIG. 8 is a diagram illustrating a relation between the thickness of the light confinement layer and the light confinement coefficient in the vertical direction with parameters such as of the number of well layers of the multi-quantum well structure.

FIG. 8 shows this relation, from which it is found that when the number of the well layers 101 is large and the thickness is less than 1000 Angstroms, the light confinement coefficient becomes larger as the light confinement layer 103 becomes thicker.

Accordingly, when the light confinement layer 103 having the SCH structure 100 at the active region 10 is thinner than the light confinement layer 103 at the saturable absorption region 11, the light confinement coefficient of the active region 10 is low and the light confinement coefficient of the saturable absorption region 11 is high, thereby making it likely that pulsation oscillation will occur.

The method of fabricating a semiconductor laser according to this second embodiment is approximately the same as the method according to the first embodiment except, in place of growing the active layer 3 having different thicknesses t1 and t2, the active layer 3 having SCH structures 100 and 110 is grown, respectively, by MOCVD or MBE.

in this second embodiment, the light confinement layer 103 of the SCH structure 100 at the active region 10 is thinner than the light confinement layer 103 of the SCH structure 110 at the saturable absorption region 11 and the light confinement coefficient perpendicular to the active region 10 is smaller than that of the saturable absorption region 11. Therefore, the function of the saturable absorption region is enhanced to increase the maximum light output during pulsation oscillation. The pulsation oscillation is maintained at a high power light output and the allowable ranges of the width W of the active region 10 and the remaining thickness d of the upper cladding layer 4 are increased, thereby enabling fabrication of a pulsation oscillation laser at high yield. In addition, the fabrication of the laser can be performed with only two crystal growth steps, as in the prior art, without making the fabrication process complicated.

Embodiment 3

In a semiconductor laser according to a third embodiment of the present invention, in the laser having an active layer 3 comprising an MQW structure, the number of well layers 101 of the active region 10 of the active layer 3 is smaller than the number of the well layers 101 of the saturable absorption region 11. For example, the number of well layers 101 of the active region 10 is selected as 3 and the number of the well layers 101 of the saturable absorption region 11 is selected as 5. Thereby, the light confinement coefficient of the active region 10 is decreased and the light confinement coefficient of the saturable absorption region 11 is increased, providing the same effects as in the second embodiment.

The fabrication of a semiconductor laser according to this third embodiment is similar to the methods of fabricating a semiconductor laser according to the first and second embodiments.

In this third embodiment of the present invention, the number of well layers 101 of the SCH structure 100 at the active region 10 is smaller than the number of well layers 101 of the SCH structure 110 at the saturable absorption region 11 and the light confinement coefficient perpendicular to the active region 10 is smaller than the light confinement coefficient perpendicular to the saturable absorption region 11. Therefore, a semiconductor laser capable of producing pulsation oscillation at a high power light output is obtained and, further, this laser can be fabricated at high yield with wide allowable ranges of the width W of the active region 10 and the remaining thickness d of the upper cladding layer 4. The fabrication process is also not so complicated.

Embodiment 4

A semiconductor laser according to a fourth embodiment of the present invention is a laser having an active layer 3 comprising an MQW structure in which the thickness of the well layers 101 of the active region 10 of the active layer 3 is smaller than the thickness of the well layer 101 of the saturable absorption region 11, whereby the light confinement coefficient of the active region 10 is small while the light confinement coefficient of the saturable absorption region 11 is large as in the second and the third embodiments.

The fabrication method of a semiconductor laser according to this fourth embodiment is similar to those of the first, second, and third embodiments.

In this fourth embodiment, the well layer 101 of the SCH structure 100 at the active region 10 is thinner than the well layer 101 at the saturable absorption region 11, thereby making the light confinement coefficient perpendicular to the active region 10 smaller than that of the saturable absorption region 11. Therefore, a semiconductor laser producing pulsation oscillation at a high power light output is obtained and can be fabricated at high yield with wide allowable ranges for the width W of the active region 10 and the remaining thickness d of the upper cladding layer 4. Also the fabrication is not so complicated.

Embodiment 5

In the first embodiment, as shown in FIGS. 3(a) and 3(b), and in the second embodiment, as shown in FIG. 7, the light confinement coefficient in the perpendicular direction, $\xi y$, is changed at the active region 10 and at the saturable absorption layer 11. However, the differential gain can be changed at both regions to provide a semiconductor laser with similar effects.

Figure 10:
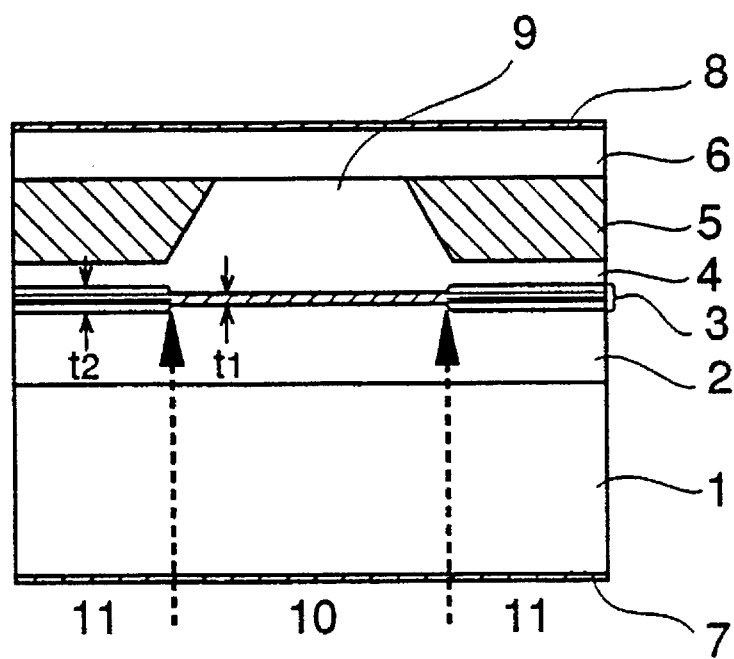
FIG. 10 is a cross-sectional view illustrating a pulsation oscillation semiconductor laser according to a fifth embodiment of the present invention.

More particularly, a fifth embodiment as shown in FIG. 10, of the present invention has a differential gain at the active region 10 smaller than the differential gain of the saturable absorption region 11. More particularly, a structure having a small differential gain in the active region 10 and a large differential gain in the saturable absorption region 11 is realized by forming the active region 10 as a DH structure (bulk) and forming the saturable absorption region 11 as an MQW structure. The fact that the differential gain in the active region 10 is small and the differential gain in the saturable absorption region 11 is large makes pulsation oscillation easier.

The method of fabricating a semiconductor laser according to this fifth embodiment is similar to those of the first to fourth embodiments.

In this fifth embodiment, because the differential gain of the active region 10 is smaller than the differential gain of the saturable absorption region 11, the light confinement coefficient perpendicular to the active region 10 is smaller than that in the saturable absorption region 11, whereby a semiconductor laser producing pulsation oscillation at a high power light output is obtained and can be fabricated at high yield with wide allowable ranges for the width W of the active region 10 and the remaining thickness d of the upper cladding layer 4. Also the fabrication is not so complicated.

While the first to fifth embodiments were examples of an inner stripe structure, a laser having another structure including an active region and a saturable absorption region may be employed with the same effects.

Embodiment 6

Figure 4A:
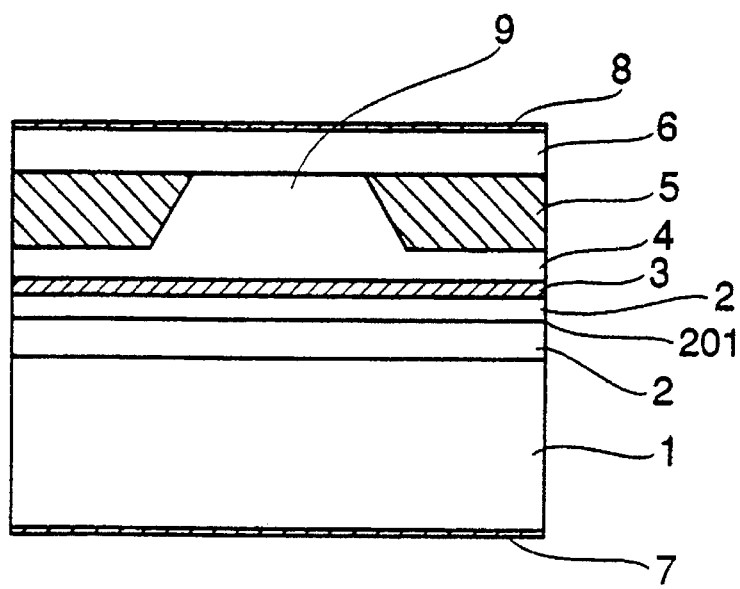
FIGS. 4(a) and 4(b) are a cross-sectional view illustrating a pulsation oscillation semiconductor laser according to a sixth embodiment of the present invention and a diagram illustrating its energy band structure, respectively.
Figure 4B:
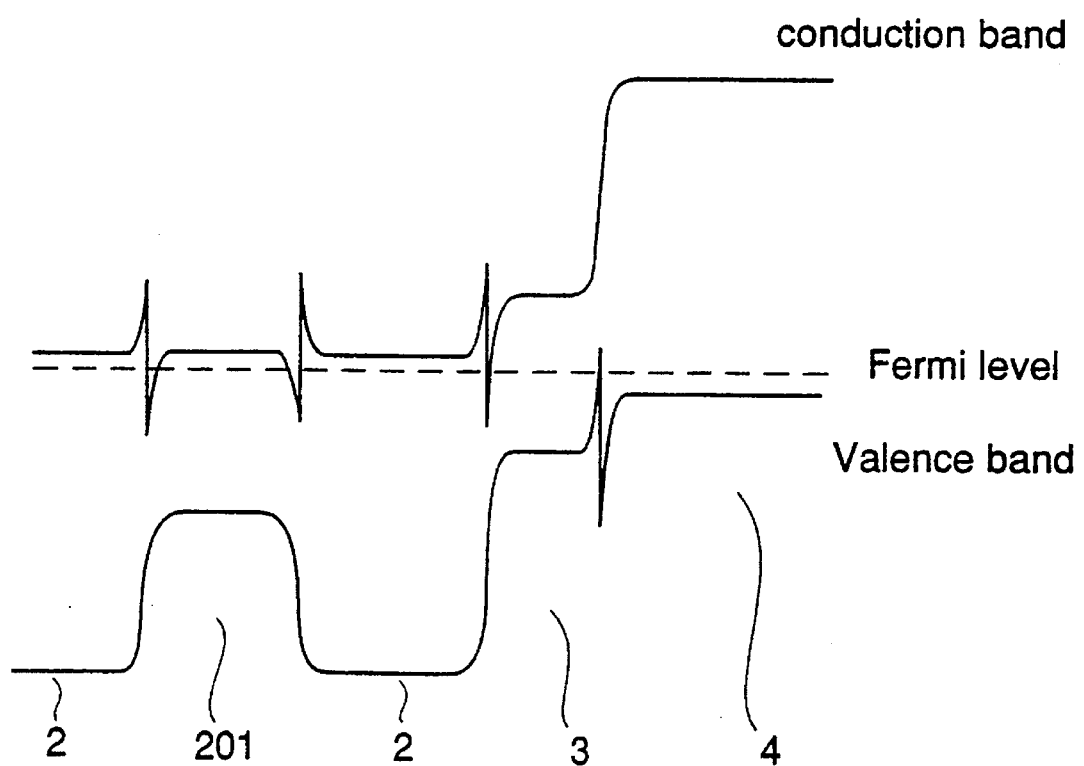

FIG. 4(a) shows a cross-sectional view illustrating a pulsation oscillation semiconductor laser according to a sixth embodiment of the present invention and FIG. 4(b) is a diagram illustrating the band structure thereof. In the figures, reference numerals 1 to 9 designate the same or corresponding parts as in FIG. 1. Reference numeral 201 designates a saturable absorption layer disposed at a position in the lower cladding layer 2.

The composition of the saturable absorption layer 201 is the same as that of the active layer 3 or is selected to have a narrower energy band gap than that of the active layer 3 and the thickness of the saturable absorption layer 201 is equal to that of the active layer 3, for example, 0.08 μm, or smaller than that. Further, the carrier concentration of the saturable absorption layer 201 is set so that the layer 201 is doped with impurities producing n type conductivity and in a concentration that aligns the lower edge of the conduction band of the layer 201 with the lower edge of the conduction band of the lower cladding layer 2, or lowers the lower edge of the conduction band of the layer 201 relative to that of the lower cladding layer 2o The compositions, thicknesses, and the like of the other layers are the same as those in the first embodiment.

The method of fabricating a semiconductor laser according to this sixth embodiment is approximately the same as the method of fabricating a laser according to the prior art. More particularly, while the lower cladding layer 2, the active layer 3, and the upper cladding layer 4 are grown on the substrate 1 by MOCVD or MBE, they may be grown by MOCVD or MBE including the saturable absorption layer 201.

In a laser according to this sixth embodiment, the saturable absorption layer 201 is doped with impurities so that the lower edge of the conduction band of the saturable absorption layer 201 coincides with the lower edge of the conduction band of the lower cladding layer 2 or is lower than that, i.e., so that no barrier is formed against the flow of majority carriers by the saturable absorption layer 201. Accordingly, the majority carriers are injected into the active layer 3 through the saturable absorption layer 201 and, as in the prior art, laser oscillation occurs in the active region of the active layer 3. On the other hand, the saturable absorption layer 201 functions as the saturable absorption region in the prior art, and when the laser light is weak, it functions as an absorber to the laser light while, when the light intensity increases to some extent, the absorption of light stops and the absorption region functions as a transparent material. Furthermore, because the saturable absorption layer 201 in this sixth embodiment is positioned parallel to the active layer 3, it functions as a saturable absorber for the active region 10 of the active layer 3 more effectively than in the prior art. A pulsation oscillation semiconductor laser effectively functioning as a Q switch for light and producing pulsation oscillation at a high power light output is obtained and provides wide allowable ranges for the width W of the active region 10 and the remaining thickness d of the upper cladding layer 4, thereby enabling fabrication at high yield.

While in the sixth embodiment, the saturable absorption layer is provided in the lower cladding layer 2 below the active layer 3, the saturable absorption layer may be located in the upper cladding layer 4 above the active layer 3.

Embodiment 7

While in the sixth embodiment, the saturable absorption layer 201 is provided in the lower cladding layer 2, in the seventh embodiment of the present invention, saturable absorption layers are provided at both sides of the active layer 3.

Figure 9A:
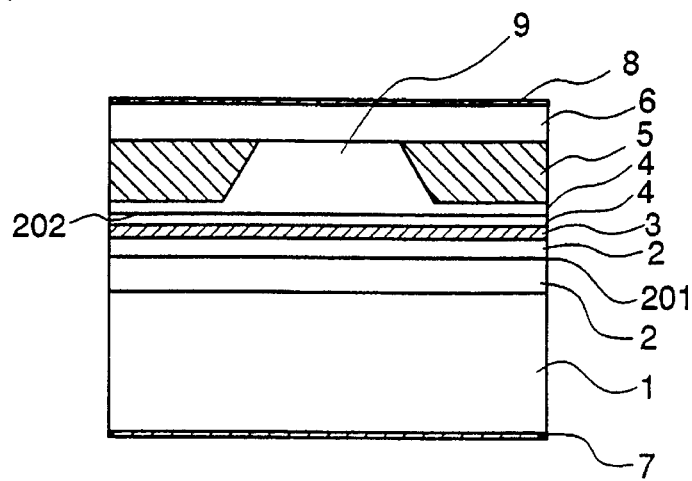
FIGS. 9(a) and 9(b) are a cross-sectional view illustrating a pulsation oscillation semiconductor laser according to a seventh embodiment of the present invention and a diagram illustrating its energy band structure, respectively.
Figure 9B:
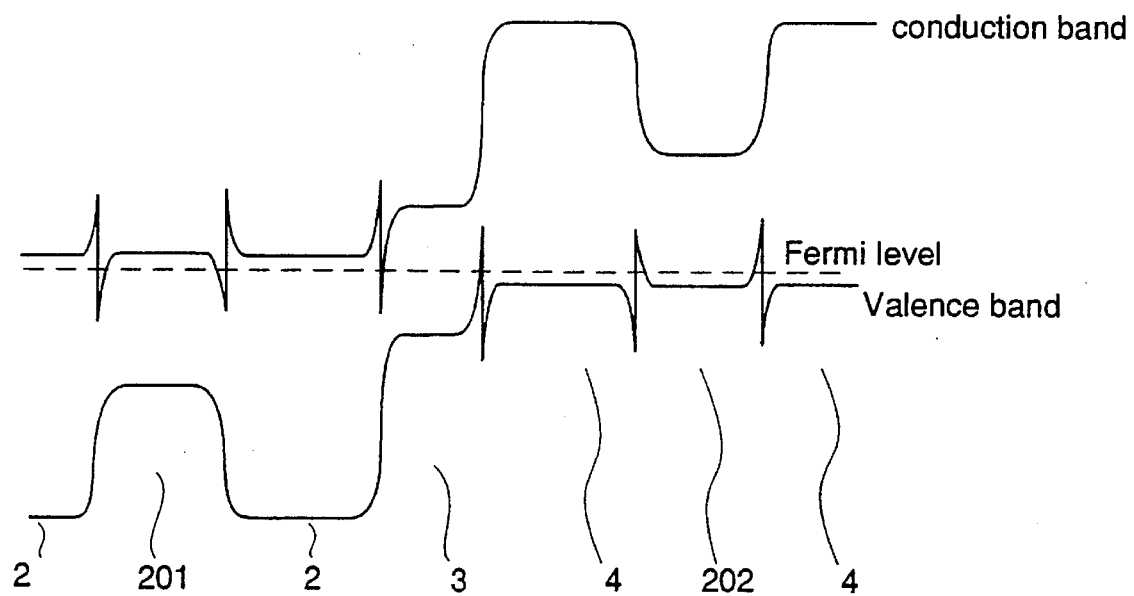

FIG. 9(a) shows a seventh embodiment of the present invention in which the saturable absorption layers 201 and 202 are respectively provided in the upper and lower cladding layers 2 and 4, at both sides of the active layer 3. Thereby, the saturable absorption layer 201 functions as a saturable absorber more significantly and more effectively as a Q switch for light. In FIG. 7, the upper cladding layer 4 is p type and the saturable absorption layer 202 at the side of the upper cladding layer 4 is doped p type so that the upper edge of the valence band of the saturable absorption layer 202 coincides with the upper edge of the valence band of the upper cladding layer 4 or so that the upper edge of the valence band of the saturable absorption layer 202 is located above the upper edge of the valence band of the upper cladding layer 4.

While the first to seventh embodiments may be employed independently, they may be combined to provide a semiconductor laser having more effects.

While the first to seventh embodiments illustrate examples having n type lower cladding layers and p type upper cladding layers, the conductivity types of the upper and lower cladding layers may be reversed with similar effects as in the described embodiments.

What is claimed is:

1. A semiconductor laser device comprising:

a semiconductor substrate:

semiconductor layers disposed on said semiconductor substrate and including an active layer and cladding layers sandwiching said active layer; and current injecting means for regulating a current injection region in said active layer into which a current is injected wherein a coefficient of light confinement in said current injection region perpendicular to said semiconductor substrate is lower than a coefficient of light confinement in a saturable absorption region perpendicular to said semiconductor substrate, outside said current injection region, and into which no current is injected.

2. The semiconductor device of claim 1 wherein said active layer is comprised in a double heterojunction structure and said active layer has a thickness at said current injection region smaller than the thickness of said active layer in said saturable absorption region.

3. The semiconductor device of claim 1 wherein said active layer comprises a multi-quantum well structure and including a light confinement layer that is thinner at said current injection region than in said saturable absorption region.

4. The semiconductor device of claim 1 wherein said active layer comprises a multi-quantum well structure having alternating well layers and barrier layers, wherein more of said well layers are present in said current injection region than in said saturable absorption region.

5. The semiconductor device of claim 1 wherein said active layer comprises a multi-quantum well structure having alternating well layers and barrier layers and said well layers at said current injection region are thinner than said well layers in said saturable absorption region.

6. A semiconductor laser device comprising:

a semiconductor substrate:

semiconductor layers disposed on said semiconductor substrate and including an active layer and cladding layers sandwiching said active layer; and current injecting means for regulating a current injection region in said active layer into which a current is injected wherein a differential gain of said active layer in said current injection region is smaller than differential gain in a saturable absorption region into which no current is injected.

7. The semiconductor device of claim 6 wherein said active layer in said current injection region is homogeneous and said active layer in said saturable absorption region is a multi-quantum well structure.

8. A semiconductor laser device comprising:

a semiconductor substrate;

semiconductor layers successively disposed on and parallel to said semiconductor substrate, said semiconductor layers including an active layer and cladding layers sandwiching said active layer; and current injecting means for regulating a current injection region in said active layer into which a current is injected and including a saturable absorption layer disposed within one of said cladding layers parallel to said active layer, said saturable absorption layer dividing one of said cladding layers into two parts, having an energy band gap no larger than said active layer, and containing dopant impurities in a concentration so that no barrier to majority carriers is formed at junctions of said saturable absorption layer and said cladding layer within which said saturable absorption layer is disposed.

9. The semiconductor device of claim 8 including saturable absorption layers disposed in each of said cladding layers.

* * * * *